(12) United States Patent
Mori

(10) Patent No.: US 6,310,302 B1
(45) Date of Patent: Oct. 30, 2001

(54) WIRING STRUCTURE OF WIRE AND WIRING METHOD

(75) Inventor: Toshiyuki Mori, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/225,320

(22) Filed: Jan. 5, 1999

(30) Foreign Application Priority Data

Jan. 6, 1998 (JP) .................................................. 10-001122

(51) Int. Cl.⁷ ....................................................... B21F 15/02
(52) U.S. Cl. ......................... 174/261; 29/846; 174/72 A; 140/111; 301/777
(58) Field of Search ................................. 174/72 A, 250, 174/253, 261, 267; 29/850, 846, 836; 140/111; 361/777; 156/290

(56) References Cited

U.S. PATENT DOCUMENTS

| 4,943,109 | * | 7/1990 | Skrbina et al. ..................... 174/72 A |
| 5,798,012 | * | 8/1998 | Krane et al. ..................... 156/290 X |

FOREIGN PATENT DOCUMENTS 54-6608    6/1993   (JP) .

\* cited by examiner

Primary Examiner—Albert W. Paladini
(74) Attorney, Agent, or Firm—Finnegan, Henderson, Farabow, Garrett & Dunner, L.L.P.

(57) ABSTRACT

A wire is arranged on a base and pushed to the base with tips. Then, the tips are welded to the base while pushing the tips to the base, thereby to fix the wire to the base and conduct a wiring of the wire on the base in order. Firstly, these wire arranging process and tip welding process are applied to a wiring starting point of the wire, and then the next wire arranging process and tip welding process are applied to the next fixing point of the wire in order.

11 Claims, 5 Drawing Sheets

WIRING STRUCTURE OF WIRE AND WIRING METHOD

FIELD OF THE INVENTION

This invention relates to a wiring structure of wire and a wiring method in which the wire is arranged on and fixed to a base of insulation.

DESCRIPTION OF THE RELATED ART

A number of wires are arranged on a door and the like of a vehicle, so that the door can get functions such as power window system, door locking system and the like.

Utility model laid-open No. 5-46608 shows an earlier art of a wiring structure of wires. A door of a vehicle is provided with a base of insulation such as resin and wires are arranged on the base. The base is provided with a plurality of small wiring grooves on an upper surface thereof along a wiring route. The wires are laid in the wiring grooves for wiring. The wires are properly secured to the base with clamps and the like.

However, in the earlier art, it is needed to make the wiring grooves in the base along the wiring route. When there are a number of wiring routes, it is troublesome to make a large number of wiring grooves in the base. Besides, even if the wires are secured to the base with the clamps, it is difficult to obtain a certain fixation and it is unstable.

Further, when the base has a complicated structure in which the base is bent or raised at the middle portion thereof, it becomes very troublesome to arrange the wires and it is impossible to arrange the wires in manufacturing line.

SUMMARY OF THE INVENTION

It is therefore an object of the present invention to provide a wiring structure of wires and wiring method which can easily arrange wires, certainly fix the wires on a base, and perform a wiring process that arranges the wires on wiring routes which have three dimensional shapes.

To achieve an object of the present invention, there is provided with a wiring structure of wire, comprising:

a base;

a wire adopted to be arranged on the base; and tips with which predetermined portions of the wire are pushed on the base, the tips adopted to be welded to the base.

With this structure, the wire is pinched between the tips and the base and the tips are welded to the base, so that the wire is fixed to the base due to the welded tips. Accordingly, it is possible to perform a wiring of the wire without forming a small recesses on the surface of the base. Moreover, the wire can be certainly fixed to the base without clamps for securing the wire to the base.

Preferably, each tip is formed with a recess which the wire fit into. With this structure, the wire can be certainly secured to the base. Accordingly, it is possible to perform a wiring process in which the wire is precisely placed on the base without a displacement of the wire at a welding of the tips.

Preferably, the base has a face, which the wire is arranged, comprising a plurality of steps which have various heights. Even if the face of the base has a complicated structure including a plurality of steps, the wiring of the wire can be easily performed because the wire is fixed with the tips.

From another aspect of the present invention, there is provided a wiring method of wire, comprising:

arranging a wire on a base;

pushing a predetermined portion of the wire on the base with a tip; and welding the tip to the base while pushing the tip to the base, thereby to fix the wire to the base and conduct a wiring of the wire on the base.

In this wiring method of a wire, the tips are welded while arranging the wire on the base and the wire is fixed on the base due to the welding of the tips. Accordingly, it is possible to perform a wiring of the wire without forming a small recesses on the surface of the base. Moreover, the wire can be certainly fixed to the base.

Preferably, the arranging, pushing and welding processes are applied to a wiring start point of the wire to fix the wiring start point to the base, and then the next arranging, pushing and welding processes are applied to the next fixing point in order.

In this wiring method of a wire, a wiring start point of the wire is pushed to the base with the tips and fixed on the base by welding the tip to the base. Due to this fixation of the tips to the base, it can be avoided that the wiring start point of the wire comes off from the base and it is possible to smoothly perform the following wiring processes on the basis of the wiring start point of the wire.

DETAILED DESCRIPTION OF THE PREFERRED EMBODIMENT

Figure 1:
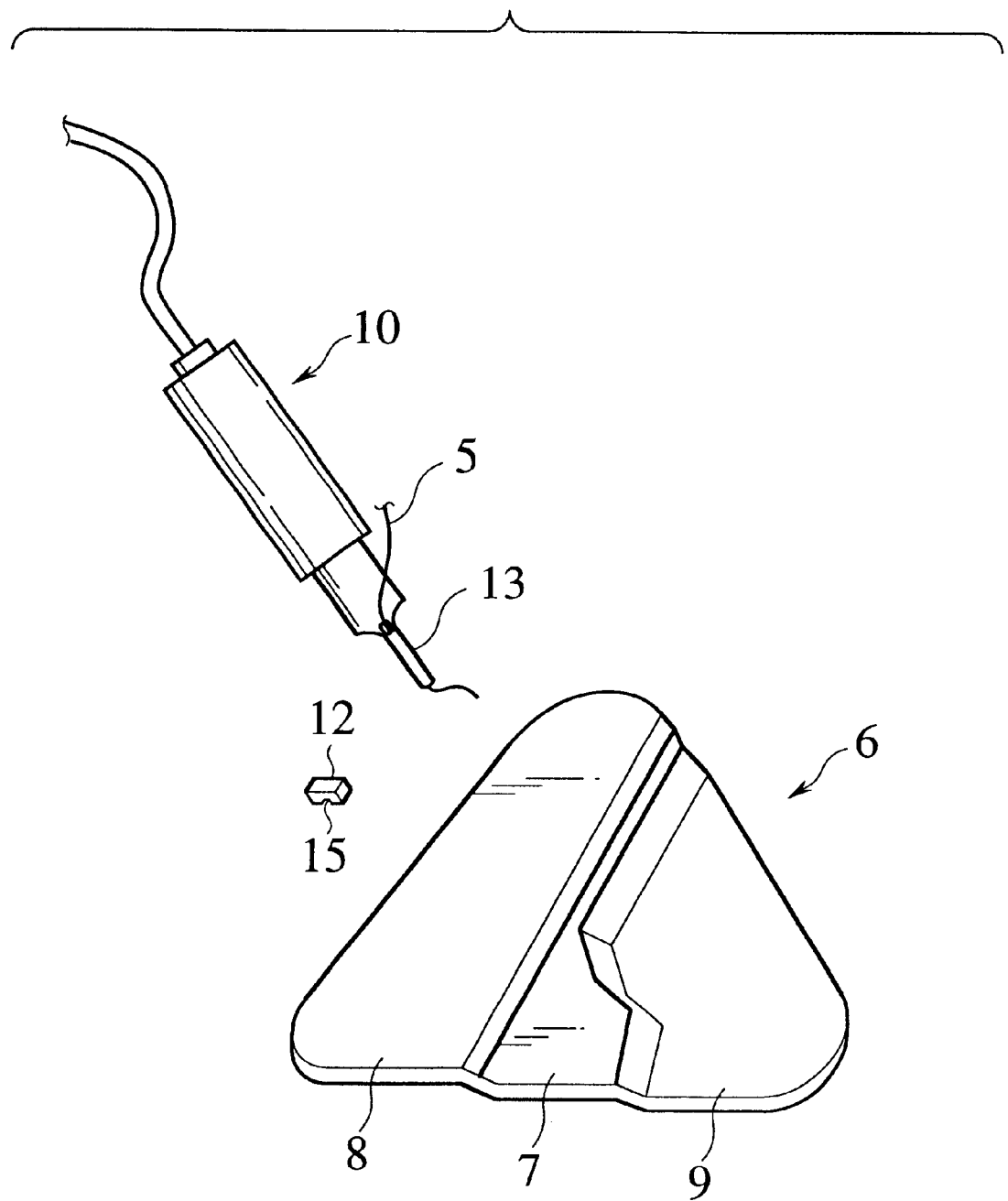
FIG. 1 shows a base, tip and wiring tool adopted to an embodiment of the present invention.

An embodiment of the present invention will be described with reference to the accompanying drawings.

Now referring to FIGS. 1 to 6, a wire 5 is arranged on a base 6. A covered wire, a bare wire, an enamel line and the like are used as the wire 5. The base 6 is made of insulation such as resin. The base 6 is attached to a door panel, roof panel and the like of a vehicle after wiring of the wires 5. For this attaching process, the base 6 is formed so as to match the shape of a member at a position where the base 6 is attached.

As shown in figures, the base 6 has a triangle shape and has the first step 7 at a middle portion thereof. The first step 7 is recessed from the remaining portion. The second and third steps 8 and 9 are arranged on the both side of the first step 7. The third step 9 which is arranged on the right side in the figures has a lower position than the second step 8 which is arranged on the left side. Thus, the base 6 has a complicated three dimensional structure.

In this embodiment, a wiring tool 10 is used to arrange the wire 5 on the base 6. Tips 12 are used to secure the wire 5 on the base 6 and an ultrasonic welder 11 is used to weld the tips 12 to the base 6. The wiring tool 10 is provided with at the tip thereof a wire holding tube 13 which holds the wire 5. The wiring tool 10 is controlled to move in its entirety in three dimensional directions while holding the wire 5. With this three dimensional movement, the wiring tool 10 draws out the wire in order from a wire roll and arrange the wire 5 on the base 6.

The ultrasonic welder 11 pushes the tip 12 on the base and is provided with ultrasonic horn 14 at the tip thereof. The horn 14 is used to apply ultrasonic vibration to the tip 12. This ultrasonic welder 11 is controlled to move in its entirety in three dimensional directions as well.

In this embodiment, the ultrasonic welder 11 is to conduct an after treatment to the wire 5 arranged with the wiring tool 10 and to trace a locus of the wiring tool 10. To realize these controls, the wiring tool 10 and the ultrasonic welder 11 are attached to six axes robot, which makes it possible to certainly move them with respect to the optional position of the base 6. Thus, the wiring of the wires 5 is automatically conducted and a quick and labor saving wiring can be performed.

The tip 12 has a shape of small piece of insulation such as resin. The tip 12 is fused by the ultrasonic vibration and welded to the base 6. For this reason, a insulation which is of the same homogeneous material as the base and has a good compatibility with the base 6 is used as the tip 12.

The tip 12 fixes the wire 5 to the base 6 by fusing with the base 6 while the wire 5 is pushed on the base b. In this embodiment, the tip 12 is formed with a recess 15 at the bottom thereof. The recess 15 has a dimension similar to or slightly larger than the outside diameter of the wire 5 so that the wire 5 can fit into the recess 15. By fitting the wire 5 into the recess 15, the displacement of the wire 5 can be avoided and the wire 5 is secured on the base 6. Accordingly, even if the ultrasonic welder 11 apply an ultrasonic vibration to the tip 12 to fuse the tip 12, the displacement of the wire 5 due to the ultrasonic vibration can be avoided and the wire 5 can be certainly secured on a precise position.

Figure 2:
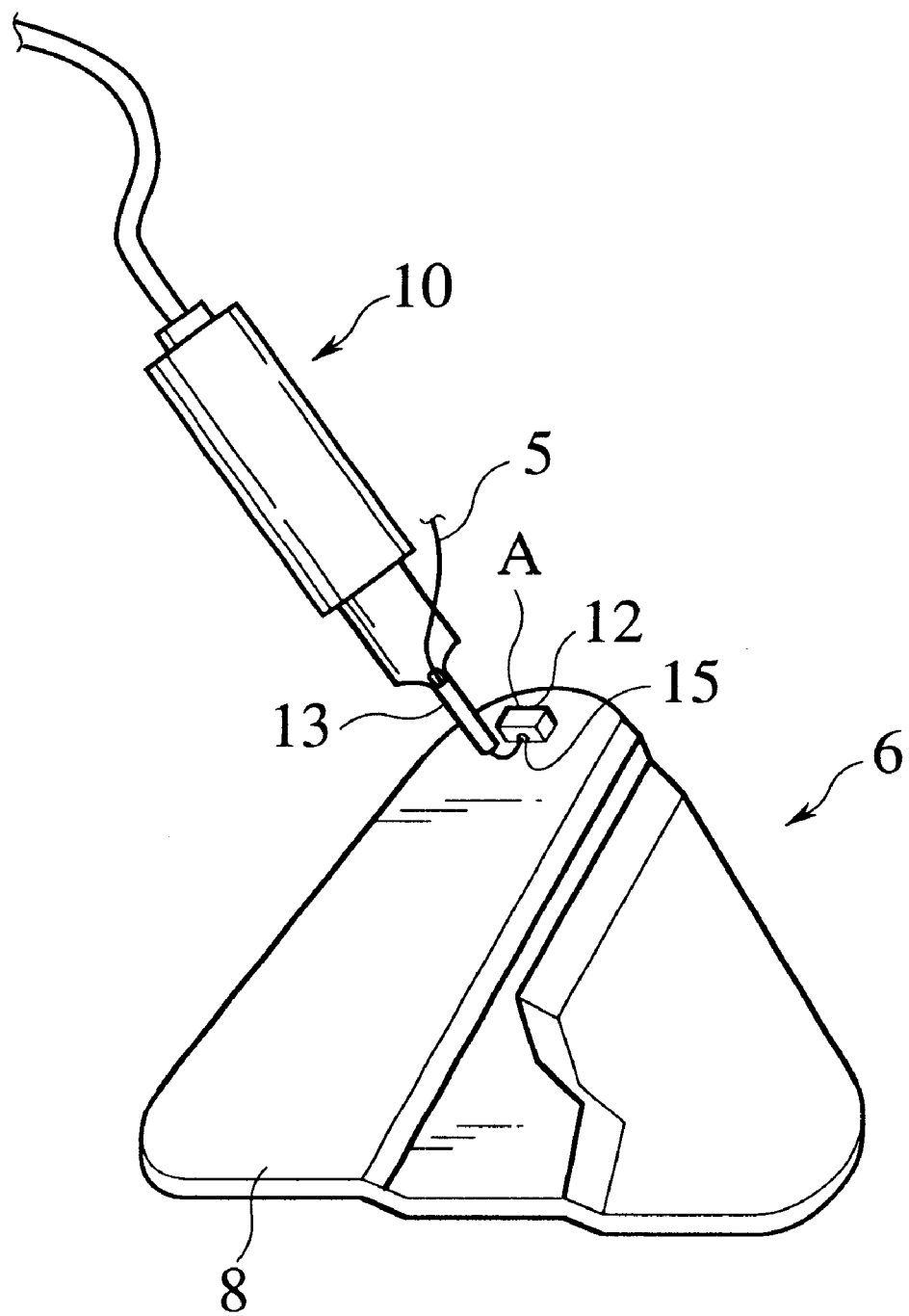
FIG. 2 shows a state in which a wiring start point of the wire is arranged on the base and a tip is put on the wiring start point through the wiring tool.

Next, a wiring process of the wire 5 according to this embodiment will be described. As shown in FIG. 2, by moving the wiring tool 10 over the base 6, the wiring tool 10 is positioned at the first fixing point (wiring start point) A that is a start point of wiring. Then the tip 12 is put on the wiring start point A of the wire 5. A carrying robot carries the tip 12 to the wiring start point A. By putting the tip 12 on the wiring start point A of the wire 5, the wire 5 fits into the recess 15 at the bottom of the tip 12.

Figure 3:
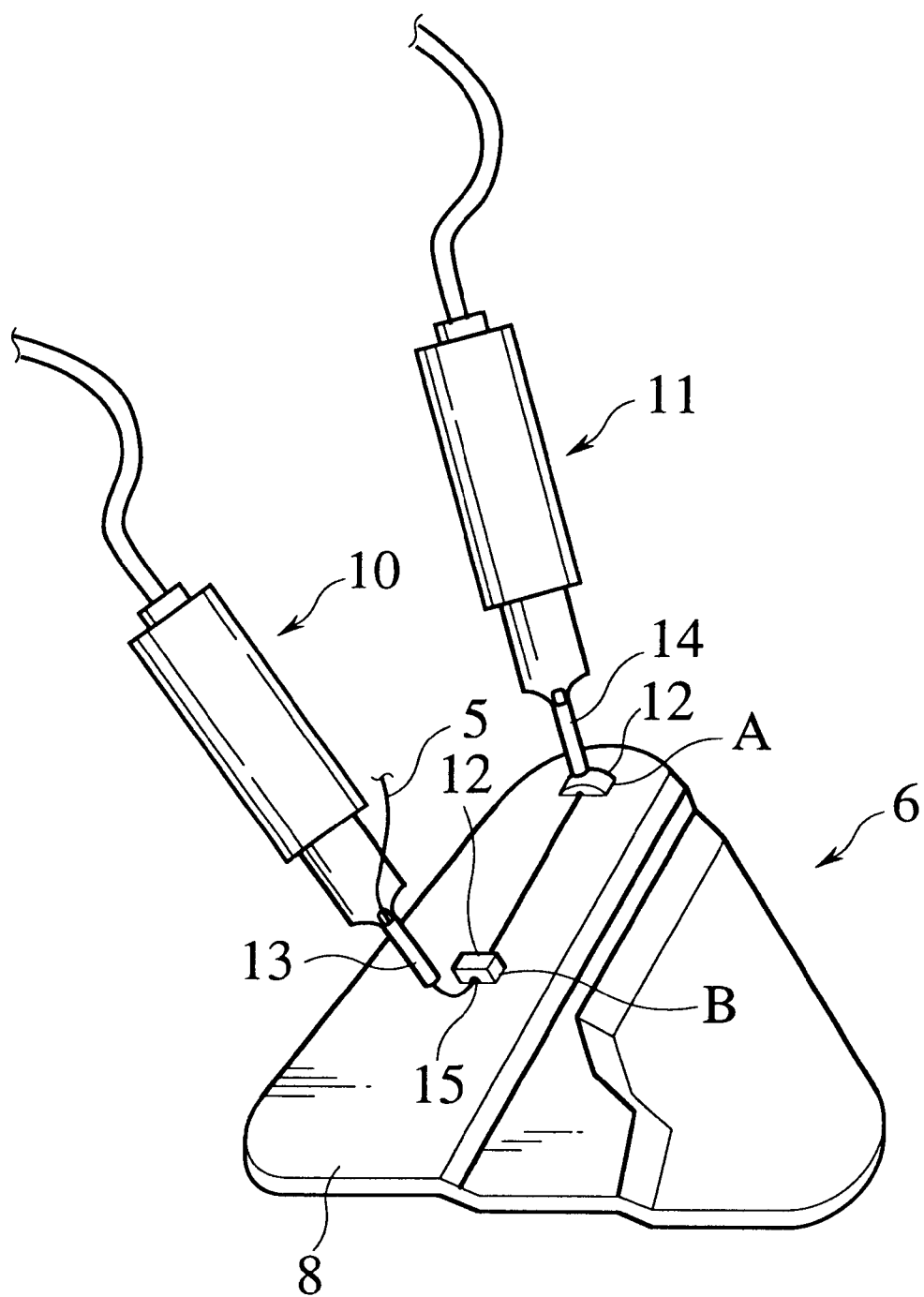
FIG. 3 shows a state in which a tip of the wiring start point is pushed to the base and welded and the wire and the tip are put on the next fixing point.

After that, as shown in FIG. 3, the ultrasonic welder 11 goes down to the wiring start point A of the wire 5 and pushes the tip 12 to the wiring start point A on the base 6. Then, the ultrasonic horn 14 applies ultrasonic vibration to the tip 12 in the condition in which the tip 12 is pushed to the base 6. With the application of the ultrasonic vibration, the contact portions of the tip 12 and the base 6 are fused so that the tip 12 is fixed to the base 6, and thus the wire 5 between the tip 12 and base 6 is fixed to the base 6 at the wiring start point A.

With this fixation of the wiring start point A of the wire 5, it is avoided that the wiring start point A of the wire 5 comes off from the fixed position. Thus, it is possible to smoothly conduct the wiring of the wire 5 after that on the basis of the wiring start point A.

In addition, when the tip 12 is small, the tip 12 is completely fused so that the wiring start point A of the wire 5 is fixed to the base 6. Where the wire 5 is a covered wire, the insulation cover over the wire core is in contact with the base 6 and the tip 12. The insulation cover is fused as well as the tip 12 so that the wire 5 is fixed to the base 6.

After fixing the wiring starting point A as described above, the wiring tool 10 is moved to the second fixing point B on the second step 8 while drawing out the wire 5 (refer to FIG. 3). With respect to the second fixing point B, as well as the first fixing point A, the tip 12 is put on the base 6 and the ultrasonic welder 11 welds the tip 12 to the base 6, so that the wire 5 is fixed to the second fixing point B of the base 6.

Figure 4:
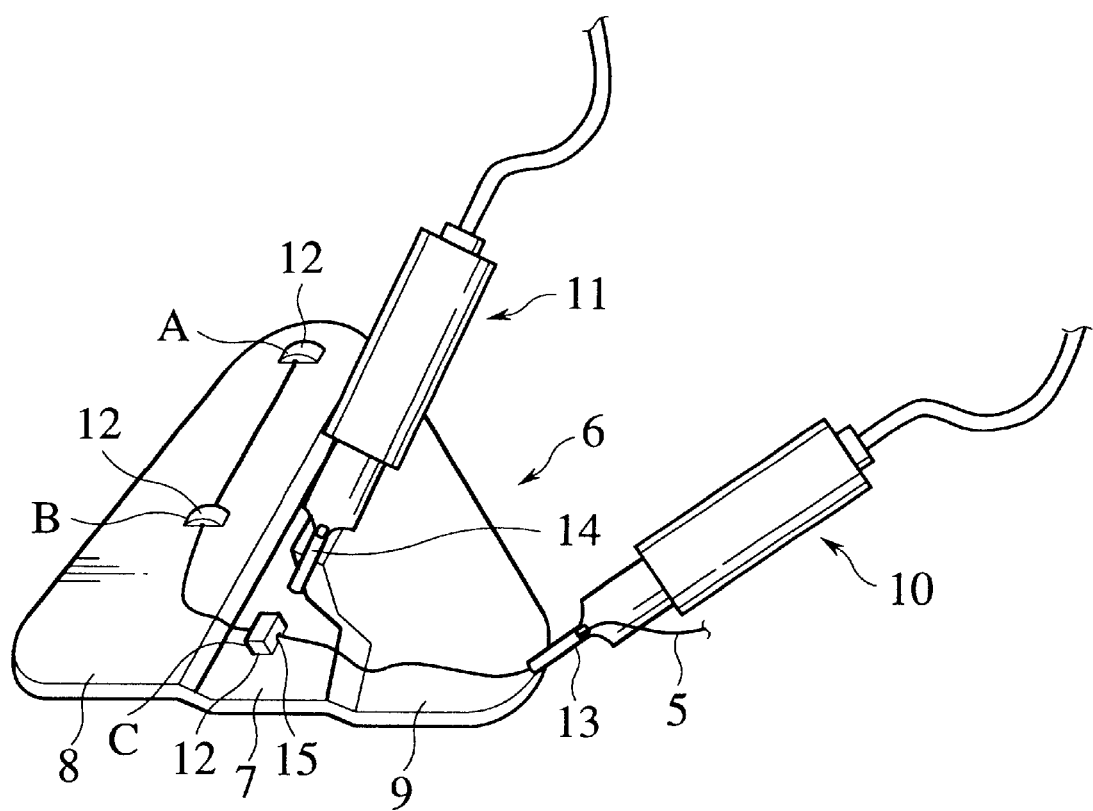
FIG. 4 shows a state in which the following wiring processes are performed on a complicated face.
Figure 5:
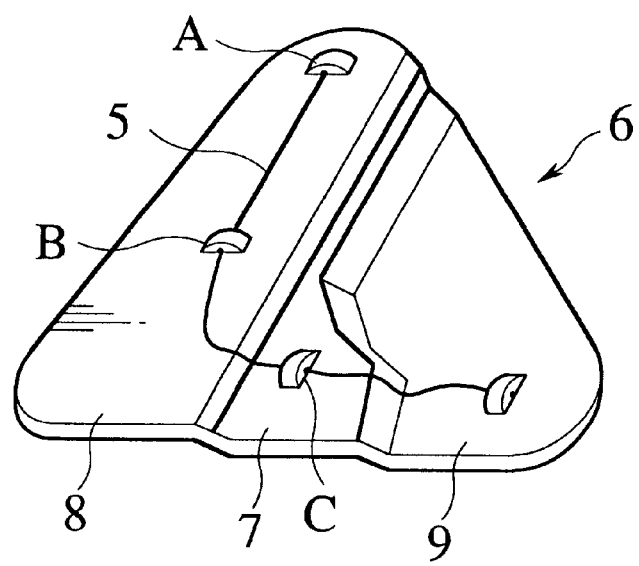
FIG. 5 shows a state in which the wiring of the wire has been performed on the base.

After that, as shown in FIG. 4, the same process is conducted with respect to the third fixing point C, so that the wire 5 is fixed to the third fixing point C of the base 6. Further, the same process is conducted with respect to the third step 9, and thus the wire 5 is fixed to the base 6 in order. Consequently, with the process described above, even if the base 6 has a three dimensional complicated shape, the wiring and fixation of the wire 5 is certainly performed.

Figure 6:
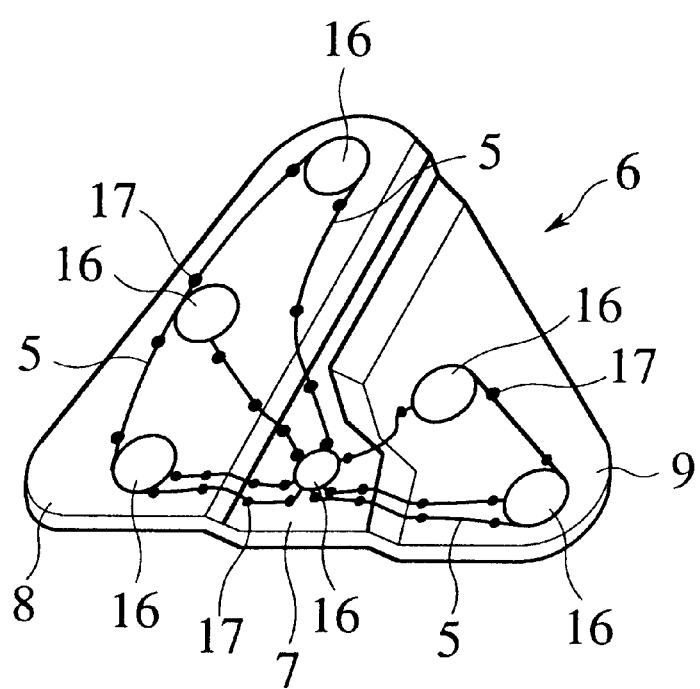
FIG. 6 shows a state in which the wiring of the wire and a punching process has been performed.

FIG. 6 shows the state in which a plurality of wires 5 have been fixed to the base 6 with the operation described above. In addition, the base 6 in FIG. 6 has a plurality of openings 16 which are formed through punching process on the predetermined portion. The opening 16 is used for example for securing the base 6 to some member such as a door of a vehicle. Through the punching process of the openings 16, a single wire 5 is cut into a plurality of wire sections, so that it is allowed to form more electric circuits on the base 6.

In addition, in FIG. 6, reference number 17 designates fixing points that are fixed to the base 6 through welding process with the tip 12 described above. Though the openings 16 are formed through punching process in FIG. 6, grooves may be formed for cutting the wires 5 into wire sections instead of the openings 16. Otherwise, both of the openings 16 and the grooves may be formed.

What is claimed is:

1. A wiring structure, comprising:
    a base;
    a wire arranged on said base by a wiring tool; and
    a plurality of tips, each tip sequentially attached to said base at a predetermined position to fix a portion of said wire to said base by an ultrasonic welder in cooperation with said wiring tool,
    wherein the base includes one or more openings cutting the wire into a plurality of wire sections.

2. A wiring structure as claimed in claim 1, wherein each tip includes a recess for inserting said portion of said wire thereinto.

3. A wiring structure as claimed in claim 1, wherein said base has a face, on which said wire is arranged, comprising a plurality of steps of varying heights.

4. The wiring structure as claimed in claim 1, wherein each tip is welded to the base.

5. The wiring structure as claimed in claim 4, wherein each tip is welded to the base by applying ultrasonic vibration to fuse the tip and the base.

6. A method for arranging a wire on a base, comprising the steps of:
    (a) positioning a portion of the wire on the base at a predetermined position by a wiring tool;
    (b) positioning a tip on the base at the predetermined position to place the portion of wire between the tip and the base;
    (c) while pushing the tip toward the base, attaching the tip to the base and thereby fixing the portion of wire to the base at the predetermined position by an ultrasonic welder in cooperation with said wiring tool; and
    (d) drawing the wire from the predetermined position to a next predetermined position on the base and repeating steps (a) through (c).

7. The method as claimed in claim 6, wherein the tip positioning step includes the step of inserting the portion of wire into a recess formed in the tip.

8. The method as claimed in claim 6, wherein the attaching step includes the step of welding the tip to the base.

9. The method as claimed in claim 8, wherein the welding step includes applying ultrasonic vibration to fuse the tip and the base.

10. The method as claimed in claim 6, further comprising the step of cutting the wire into a plurality of wire sections.

11. The method as claimed in claim 10, wherein the cutting step includes the step of forming one or more openings in the base.

* * * * *